(12) United States Patent
Fuhrmann et al.

(10) Patent No.: US 7,443,740 B2
(45) Date of Patent: Oct. 28, 2008

(54) INTEGRATED SEMICONDUCTOR MEMORY WITH ADJUSTABLE INTERNAL VOLTAGE

(75) Inventors: Dirk Fuhrmann, Apex, NC (US); Matthias Skalitz, Unterschleißheim (DE)

(73) Assignee: Infineon Technologies AG, Neubiberg (DE)

( * ) Notice: Subject to any disclaimer, the term of this patent is extended or adjusted under 35 U.S.C. 154(b) by 302 days.

(21) Appl. No.: 11/355,200

(22) Filed: Feb. 16, 2006

(65) Prior Publication Data

US 2006/0181939 A1 Aug. 17, 2006

(30) Foreign Application Priority Data

Feb. 16, 2005 (DE) .................. 10 2005 007 084

(51) Int. Cl.
*G11C 7/00* (2006.01)
(52) U.S. Cl. ................ 365/189.11; 365/201; 365/233.1
(58) Field of Classification Search ................ 365/201, 365/233, 233.1, 189.09
See application file for complete search history.

(56) References Cited

U.S. PATENT DOCUMENTS

| | | | |
|---|---|---|---|
| 5,963,502 A * | 10/1999 | Watanabe et al. ........... | 365/233 |
| 6,011,447 A * | 1/2000 | Iwasaki ...................... | 331/185 |
| 6,242,936 B1 | 6/2001 | Ho et al. | |
| 6,392,456 B1 * | 5/2002 | Pyeon et al. ................ | 327/156 |
| 6,438,067 B2 | 8/2002 | Kuge et al. | |
| 6,462,996 B2 * | 10/2002 | Ooishi ........................ | 365/201 |
| 2002/0108066 A1 * | 8/2002 | Masui et al. ................ | 713/300 |
| 2003/0179026 A1 * | 9/2003 | Alexander et al. .......... | 327/158 |
| 2004/0042331 A1 * | 3/2004 | Ikehashi et al. ............. | 365/232 |

OTHER PUBLICATIONS

Keeth, Brent, et al.; "DRAM Circuit Design, A Tutorial"; IEEE, Press Series on Microelectronic Systems, Nov. 2000.

* cited by examiner

*Primary Examiner*—Huan Hoang
*Assistant Examiner*—Anthan T Tran
(74) *Attorney, Agent, or Firm*—Edell, Shapiro & Finnan, LLC

(57) ABSTRACT

An integrated semiconductor memory includes a clock generator circuit for generating an internal clock signal that exhibits a certain phase angle with respect to an external clock signal. The phase angle is dependent on a value of the supply voltage of the clock generator circuit. The supply voltage is provided by a controllable voltage generator that includes a controllable resistor. During the production process, the supply voltage generated can be picked up at a contact pad. The value of the controllable resistor is changed in each memory chip by an automatic production machine until the supply voltage generated matches a target value. The controllable voltage generator can be adjusted individually for each memory chip via fuse elements so that the target value of the supply voltage is achieved with high accuracy for each memory chip.

12 Claims, 3 Drawing Sheets

| No. | Vdll | bit3 | bit2 | bit1 | bit0 |
|---|---|---|---|---|---|
| 1 | 1.34 | 0 | 0 | 0 | 0 |
| 2 | 1.36 | 0 | 0 | 0 | 1 |
| 3 | 1.38 | 0 | 0 | 1 | 0 |
| 4 | 1.40 | 0 | 0 | 1 | 1 |
| 5 | 1.42 | 0 | 1 | 0 | 0 |
| 6 | 1.44 | 0 | 1 | 0 | 1 |
| 7 | 1.46 | 0 | 1 | 1 | 0 |
| 8 | 1.48 | 0 | 1 | 1 | 1 |
| 9 | 1.50 | 1 | 0 | 0 | 0 |
| 10 | 1.52 | 1 | 0 | 0 | 1 |
| 11 | 1.54 | 1 | 0 | 1 | 0 |
| 12 | 1.56 | 1 | 0 | 1 | 1 |
| 13 | 1.58 | 1 | 1 | 0 | 0 |
| 14 | 1.60 | 1 | 1 | 0 | 1 |
| 15 | 1.62 | 1 | 1 | 1 | 0 |
| 16 | 1.64 | 1 | 1 | 1 | 1 |

INTEGRATED SEMICONDUCTOR MEMORY WITH ADJUSTABLE INTERNAL VOLTAGE

CROSS REFERENCE TO RELATED APPLICATIONS

This application claims priority under 35 U.S.C. §119 to German Application No. DE 102005007084.1, filed on Feb. 16, 2005, and titled "Integrated Semiconductor Memory with Adjustable Internal Voltage," the entire contents of which are hereby incorporated by reference.

FIELD OF THE INVENTION

The present invention relates to an integrated semiconductor memory with an adjustable internal voltage. The present invention also relates to a production arrangement for producing such an integrated semiconductor memory and to a method for producing such an integrated semiconductor memory.

BACKGROUND

In many semiconductor circuits, it is necessary to synchronize output signals such as, for example, data signals, with an external clock. In integrated semiconductor memories which are operated at clock frequencies above 200 MHz, special clock generator circuits are provided for this purpose. These circuits generate an internal clock signal from a clock signal which is applied from an external source. The phase angle of the internal clock signal is matched to the external clock.

To operate the clock generator circuit, the clock generator circuit needs a supply voltage which is supplied directly at the input. The accuracy of the clock generator circuit with respect to the phase angle with which the internal clock signal is generated in comparison with the external clock signal depends on, among other things, the stability of the supply voltage applied. However, since a supply voltage supplied to the integrated semiconductor memory externally is generally not stable enough to ensure that the internal clock signal will be generated with the necessary accuracy, the external supply voltage is not supplied to the clock generator circuits directly. Instead, at least one special voltage generator is provided on every semiconductor chip, which generates a stable regulated supply voltage from the externally supplied supply voltage and supplies the stable voltage to the clock generator circuit.

Although the individual voltage generator on each memory chip generates at the output a stable and regulated supply voltage for the clock generator circuit, the predetermined target value of the supply voltage still has a natural dispersion for all memory chips of a wafer or of a batch, which is influenced by process fluctuations, temperature and other factors. The stabilized supply voltages generated by the voltage generators on the memory chips of a wafer therefore deviate more or less from the predetermined target value. As a result, however, the clock generator circuits of the memory chips on a wafer are also driven by different levels of the supply voltage. Consequently, each clock generator circuit of a memory chip on a wafer generates an internal clock signal which has a different phase angle with respect to the clock signal supplied externally.

Output signals such as data signals which are synchronized with the internal clock are thus generated at different times with respect to the external clock signal. The memory chips on a wafer exhibit a different time response of the output signals. It is necessary that all memory chips, especially in memory modules comprising a number of memory chips, operate clock-synchronously with a clock signal applied externally, but also with respect to one another. This is of importance, especially when the individual memory chips which are arranged on the memory module must provide output data simultaneously.

It is necessary, therefore, that the clock generator circuits of the memory chips generate their internal clock signals with the same phase difference with respect to the clock signal applied externally. Due to the natural distribution of the voltage levels of the supply voltages which are generated by all voltage generators on a wafer, however, the clock generator circuits behave differently with respect to the phase angle of the internal clock signal generated by them with respect to the external clock signal so that the output signals are often generated with different delay times compared with a common external clock signal.

SUMMARY

The present invention provides an integrated semiconductor memory in which the phase angle of an internal clock signal can be accurately adjusted with respect to an external clock signal. The present invention also provides a production arrangement for producing an integrated semiconductor memory by which it is possible that the phase angle of an internal clock signal of an integrated semiconductor memory can be accurately adjusted with respect to an external clock signal. The present invention further provides a method for producing an integrated semiconductor memory in which the phase angle of an internal clock signal can be accurately adjusted with respect to an external clock signal.

According to an exemplary embodiment of the invention, an integrated semiconductor memory includes a clock generator circuit having at least one input terminal for applying an external clock signal, an output terminal for generating an internal clock signal, and a supply terminal for applying a supply voltage of the clock generator circuit. The clock generator circuit is constructed such that, when its input terminal is driven with the external clock signal, the clock generator circuit generates the internal clock signal at the output terminal of the clock generator circuit, the internal clock signal exhibiting a phase angle with respect to the external clock signal which is dependent on the level of the supply voltage of the clock generator. The integrated semiconductor memory also comprises a controllable voltage generator for generating an output voltage having at least one control terminal for applying a control signal. The output voltage generated by the controllable voltage generator is supplied as the supply voltage to the supply terminal of the clock generator circuit. In addition, the integrated semiconductor memory comprises a contact pad for generating a voltage. The contact pad is connected to the supply terminal of the clock generator circuit.

Since the supply voltage generated by the controllable voltage generator can be measured for each memory chip via the contact pad, the value of the supply voltage can be centered within a narrow range of tolerances around the predetermined nominal value by suitably driving the controllable voltage generator. As a result, the previous wide distribution of supply voltages which has been generated by the controllable voltage generators on each memory chip can be confined much more narrowly around the actual nominal value. The dispersion of the output timing of signals, for example of data signals, can thus be reduced. The output signals of a memory module which contains a number of memory chips are thus very well synchronized with an external clock signal. The associated higher accuracy with which the signals are output makes it possible to operate the memory chips faster with respect to the data transmission rate. Consequently, the quality is improved and the production yield is also increased.

According to another aspect of the integrated semiconductor memory of the present invention, a control circuit is provided with an input terminal for applying a test mode control signal and with an output terminal for generating a control signal for controlling the controllable voltage generator. The control circuit generates at the output a state of the control signal as a function of a state of the test mode control signal and supplies the control signal to the control terminal of the controllable voltage generator. The controllable voltage generator generates a level of its output voltage as a function of the state of the control signal.

In accordance with another aspect of the invention, the integrated semiconductor memory comprises a memory circuit and an evaluating circuit for evaluating a state of the memory circuit with an output terminal for generating the control signal for controlling the controllable voltage generator. The control signal generated by the evaluating circuit is supplied to the control terminal of the controllable voltage generator. The memory circuit contains preferably at least one fuse element.

According to another aspect of the invention, the controllable voltage generator has an input terminal for applying an input voltage. The controllable voltage generator furthermore includes a controllable resistor, the value of which is variable in dependence on the state of the control signal. The controllable voltage generator generates the output voltage of the controllable voltage generator in dependence on a voltage drop of the input voltage of the controllable voltage generator across the controllable resistor.

According to a further feature of the integrated semiconductor memory of the invention, a voltage stabilizing circuit is provided for generating a stabilized output voltage, with an external supply terminal for applying an external supply voltage. The external supply voltage is supplied to the voltage stabilizing circuit at its input. The voltage stabilizing circuit generates the stabilized output voltage from the external supply voltage supplied to it. The stabilized output voltage is supplied as the input voltage to the input terminal of the controllable voltage generator. In one embodiment, the voltage stabilizing circuit can be constructed as a band-gap reference circuit. The clock generator circuit is preferably constructed as a phase-locked loop circuit or as a delay-locked loop circuit.

According to the invention, the contact pad is constructed such that the supply voltage of the clock generator circuit can be picked up at the contact pad by an automatic production machine.

In accordance with another aspect of the invention, a production arrangement comprises an integrated semiconductor memory according to one of the abovementioned embodiments, together with an automatic production machine for measuring the supply voltage of the clock generator circuit of the integrated semiconductor memory. The automatic production machine includes a comparison device with a first input terminal for applying a first comparison voltage and a second input terminal for applying a second comparison voltage and a memory unit for storing memory states. According to an exemplary embodiment of the invention, the automatic production machine generates the test mode control signal and supplies the test mode control signal to the input terminal of the control circuit of the integrated semiconductor memory. The second input terminal of the comparison device is supplied with a level of the supply voltage of the clock generator circuit of the integrated circuit from the contact pad of the integrated circuit. The output of the comparison device is connected to the memory unit. The comparison device compares a level of the first comparison voltage and a level of the supply voltage of the clock generator circuit, supplied from the contact pad. The automatic production machine changes the state of the test mode control signal until the level of the supply voltage of the clock generator circuit matches the level of the first comparison voltage. Furthermore, the automatic production machine changes at least one of the memory states of the memory unit in dependence on the state of the test mode control signal at which the level of the supply voltage of the clock generator circuit matches the level of the first comparison voltage.

A development of the production arrangement according to the invention for producing an integrated semiconductor memory provides the automatic production machine with a programming unit for programming a fuse element of the memory circuit of the integrated semiconductor memory. The programming unit programs the fuse element of the memory circuit of the integrated semiconductor memory in dependence on the memory state stored in the memory unit.

In accordance with yet another aspect of the invention, a method for producing an integrated semiconductor memory includes providing an integrated semiconductor memory with a clock generator circuit for generating an internal clock signal with a supply terminal for applying a supply voltage, the supply voltage being generated by a controllable voltage generator. Furthermore, the integrated semiconductor memory comprises a contact pad for generating a level of the supply voltage generated by the controllable voltage generator, with a memory circuit with fuse elements. In addition, an automatic production machine is provided. A value of the controllable resistor is determined by driving the integrated semiconductor memory with a state of a test mode control signal. Subsequently, a supply voltage of the clock generator circuit is generated by the controllable voltage generator in dependence on a state of the test mode control signal. Next, the supply voltage generated by the controllable voltage generator is measured at the contact pad by the automatic production machine. The supply voltage measured at the contact pad is subsequently compared with a comparison voltage. If the two voltages do not match, the state of the test mode control signal is then changed and the process is repeated with the changed value of the test mode control signal. The state of the test mode control signal is repeatedly changed until the level of the supply voltage measured at the contact pad matches the level of the comparison voltage. A memory state is then stored in a memory unit of the automatic production machine in dependence on the state of the test mode control signal at which the level of the supply voltage of the clock generator circuit, measured at the contact pad, matches the level of the comparison voltage. The fuse element of the memory circuit of the integrated semiconductor memory is then programmed in dependence on the memory state stored in the memory unit.

The memory state specifies a nominal value of the supply voltage for the clock generator circuit. The predetermined nominal value can lie not only below but also above the comparison voltage of the automatic production machine. If the supply voltage for the clock generator circuit is generated from the voltage drop across a controllable resistor, the input voltage of the controllable voltage generator is above the comparison voltage of the automatic production machine, for example due to a level shift within the voltage stabilizing circuit.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

In the text which follows, the invention will be explained in greater detail with reference to the figures which show exemplary embodiments of the present invention.

DETAILED DESCRIPTION

Figure 1:
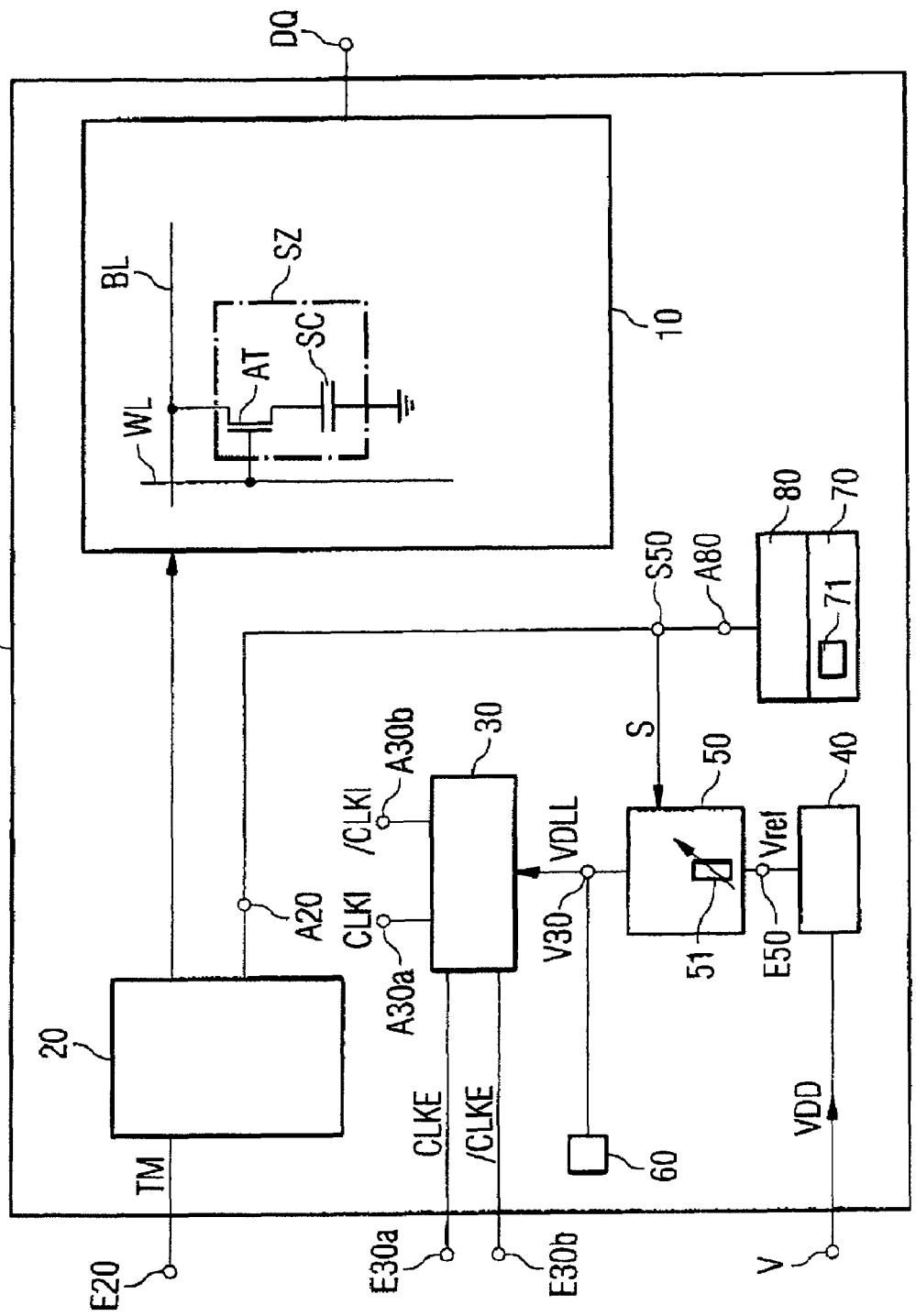
FIG. 1 shows an integrated semiconductor memory for generating an internal clock signal according to an exemplary embodiment of the invention.

FIG. 1 shows an integrated semiconductor memory 100 with a memory cell array 10 in which memory cells SZ are arranged along word lines WL and bit lines BL. In the example of FIG. 1, the memory cell SZ is constructed as a DRAM (dynamic random access memory) memory cell. The DRAM memory cell comprises a selection transistor AT and a storage capacitor SC. A control terminal of the selection transistor AT is connected to the word line WL. To control the read and write accesses to the memory cell SZ, the memory cell array 10 is driven by a control circuit 20.

During the reading-out of information from the memory cell or during the writing of information into the memory cell, the control circuit 20 generates on the word line WL a control signal having a level which controls the selection transistor AT to conduct. The storage capacitor SC is thus conductively connected to the bit line BL via the junction of the selection transistor controlled to conduct. The potential on the bit line BL to be raised or lowered depends on the charge on the storage capacitor. The shift in potential on the bit line is amplified by a read amplifier, not shown in FIG. 1, into a high or a low data level which is output at the output terminal DQ.

When information is written to the memory cell SZ, the selection transistor AT is also controlled to conduct by a corresponding level of a control voltage on the word line. On the bit line, a high voltage of, for example, 1.5 V is generated when a high data level is written in, which voltage causes a charge to flow into the storage capacitor so that a high charge level is stored in the storage capacitor. When a low data level is written in, a low voltage is fed on to the bit line. As a consequence, a low charge level is stored in the storage capacitor.

The control signals generated by the control circuit 20 for controlling the read and write accesses are generated synchronously with an internal clock signal. The internal clock signal is generated by a clock generator 30. For this purpose, the clock generator 30 has an input terminal E30a for applying an external clock signal CLKE and an input terminal E30b for applying a complementary external clock signal /CLKE.

From the external clock signal CLKE and the complementary external clock signal /CLKE respectively, the clock generator circuit 30 generates the internal clock signal CLKI at an output terminal A30a and respectively, the complementary internal clock signal /CLKI at an output terminal A30b. To operate the clock generator circuit 30, it is driven by a supply voltage VDLL at a supply terminal V30. The phase angle with which the internal clock signals CLKI and /CLKI are generated with respect to the external clock signals CLKE and /CLKE is dependent, in particular, on the level of the supply voltage VDLL. The input of the clock generator circuit 30 is, therefore, supplied with a stabilized supply voltage.

A voltage stabilizing circuit 40 is, therefore, provided on the chip of the integrated semiconductor memory, which is connected to a supply terminal V for applying an external supply voltage VDD. The voltage stabilizing circuit 40 is constructed, for example, as a band-gap reference circuit. From the external supply voltage VDD supplied at the input, voltage stabilizing circuit 40 generates a stabilized output voltage Vref.

The stabilized output voltage Vref is supplied to a controllable voltage generator 50 via an input terminal E50. The controllable voltage generator 50 generates an output voltage VDLL, which is used as supply voltage for the clock generator circuit 30 in dependence on a control signal S which is supplied to a control terminal S50 of the controllable voltage generator.

The supply terminal V30 of the clock generator circuit 30 is connected to a contact pad 60 at which the supply voltage generated by the controllable voltage generator 50 can be picked up for measurement purposes. The contact pad 60 is constructed, for example, as a metallic contact pad. The level of the supply voltage for the clock generator circuit, generated by the controllable voltage generator 50, can be measured via contact points of a measuring instrument.

In the text which follows, a method for producing an integrated semiconductor memory, in which the level of the supply voltage VDLL can be adjusted individually for each memory chip, will be explained with reference to FIGS. 2, 3 and 4.

Figures 2, 4:
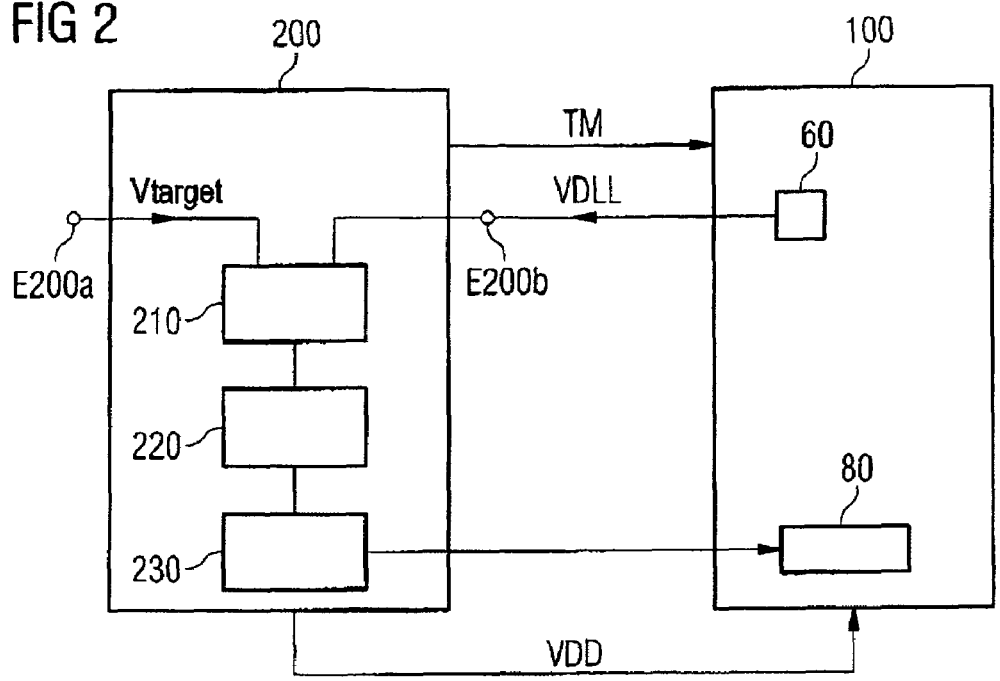
FIG. 2 shows an integrated semiconductor memory with an automatic production machine for producing an integrated semiconductor memory according to an exemplary embodiment of the invention.
FIG. 4 shows a distribution of levels of a supply voltage of a clock generator circuit in dependence on programming states of a memory unit according to an exemplary embodiment of the invention.
Figure 3:
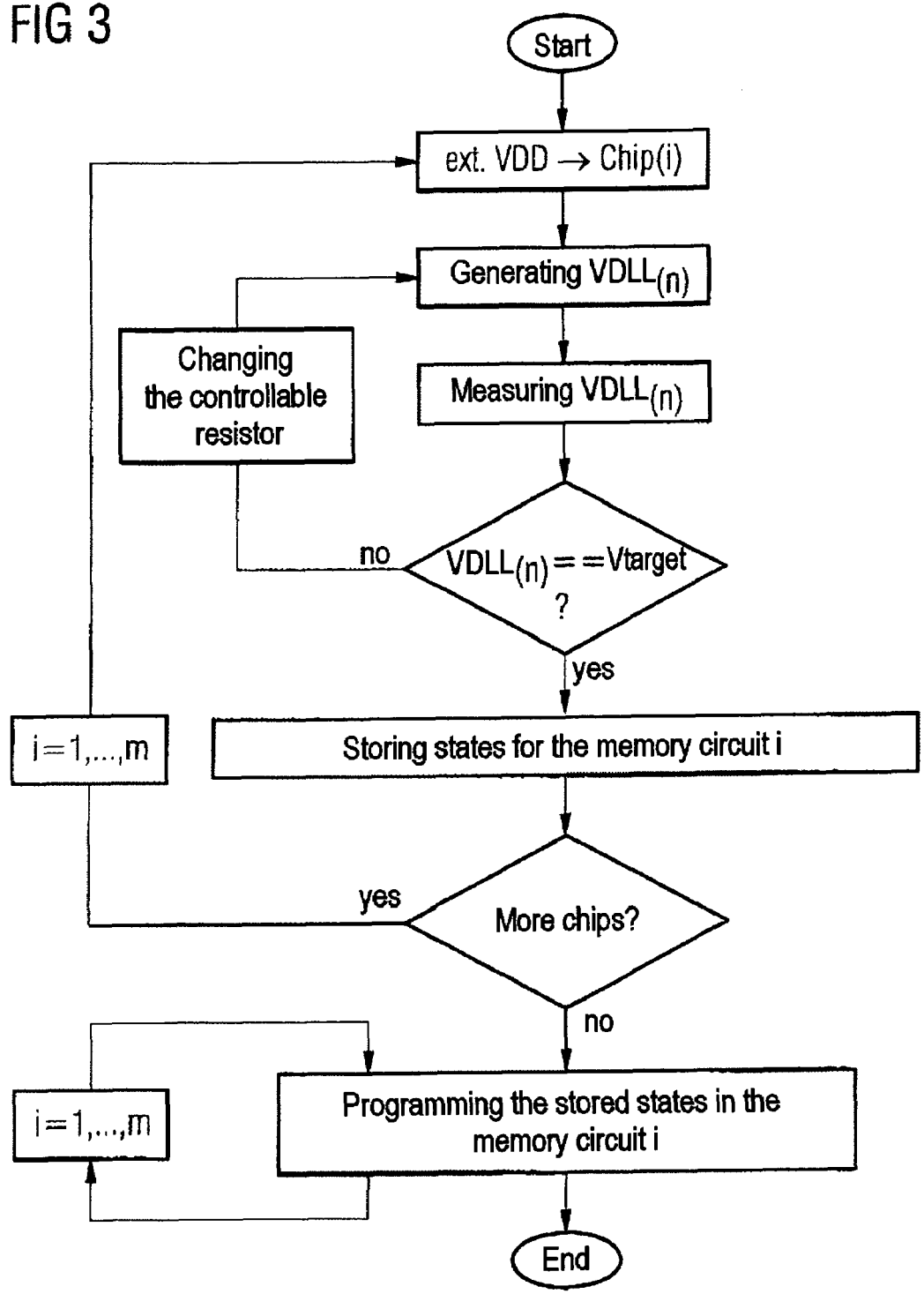
FIG. 3 shows a method for producing an integrated semiconductor memory according to an exemplary embodiment of the invention.

FIG. 2 diagrammatically shows the integrated semiconductor memory 100 and an automatic production machine 200. The automatic production machine 200 comprises a comparison device 210 with an input terminal E200a for applying a comparison voltage Vtarget and an input terminal E200b for applying a further comparison voltage. The comparison device 210 is connected to a memory unit 220. The memory unit 220 is connected to a programming unit 230.

According to the method according to the invention, it is proposed to adjust the supply voltage VDLL generated by the controllable voltage generator 50, of the clock generator circuit 30 individually for each memory chip on a wafer. For this purpose, the automatic production machine 200 drives on a wafer one of the semiconductor memories 100, the supply voltage VDLL of which is to be adjusted, with the external supply voltage VDD at its supply terminal V. No supply voltage is applied to any of the other memory chips so that the memory chips do not influence each other mutually on the wafer and the measuring result is corrupted.

Furthermore, the semiconductor memory, the supply voltage of which is to be adjusted, is driven by the automatic production machine 200 at an input terminal E20 of the control circuit 20 with a state of a test mode control signal TM. The control circuit 20 generates at its output terminal A20, in dependence on the state of the test mode control signal TM, a state of the control signal S for controlling the controllable voltage generator 50. The controllable voltage generator 50 contains a controllable resistor 51, the value of which depends on the state of the control signal S. The controllable voltage generator 50 is constructed in such a manner that it generates across the controllable resistor 51 from the stabilized voltage Vref supplied to it at its input a voltage drop which represents the output voltage of the controllable voltage generator and supplies the output voltage as supply voltage VDLL to the supply terminal V30 of the clock generator circuit 30.

After the adjustment of a value of the controllable resistor 51 as a consequence of the drive by the control signal S, the controllable voltage generator 50 generates a level of the supply voltage VDLL at the supply terminal V30. This level of the supply voltage VDLL is picked up at the contact pad 60 and supplied to the input terminal E200b of the automatic production machine 200. At the same time, a nominal value of the supply voltage VDLL is supplied to the automatic production machine 200 at the input terminal E200a with the comparison voltage Vtarget. The comparison device 210 compares the supply voltage VDLL generated by the controllable voltage generator at the contact pad 60 with the nominal value Vtarget of the supply voltage.

If the two values do not match, the automatic production machine 200 drives the integrated semiconductor memory 100 with a changed state of the test mode control signal TM. The control circuit 20 thereupon generates a changed state of the control signal S. Consequently, the controllable resistor 51 changes its value whereupon the controllable voltage generator 50 generates the supply voltage VDLL with another level. The method is continued until the comparison device 210 detects that the actual level of the supply voltage VDLL generated by the controllable voltage generator 50 matches the nominal value Vtarget of the supply voltage. In this case, a memory state which is dependent on the state of the test mode control signal at which the actual value of the supply voltage VDLL has matched the nominal value Vtarget is stored in the memory unit 220 for the memory chip. Since the value of the controllable resistor 51 depends on the state of the control signal, the stored memory state of the memory unit 220 also specifies the value of the controllable resistor at which the supply voltage VDLL generated by the controllable voltage generator matches the nominal value of the supply voltage.

The method described is repeated for all memory chips on the wafer and for all memory chips of a batch, respectively. At the end of the method, a multiplicity of memory states are stored in the memory unit 220, and in each case one memory state can be allocated to one of the memory chips of the wafer or of the batch, respectively. These memory states can be used for programming the value determined for the controllable resistors 51 of the memory chips, for which the measured level of the supply voltage VDLL matches the nominal level Vtarget, into each memory chip.

For this purpose, the integrated semiconductor memories have a memory unit 70 which contains fuse elements 71. The programming states of the fuse elements 71 are evaluated by an evaluating circuit 80. After the end of the production process, in later operation of the integrated semiconductor memory, the evaluating circuit 80 generates at an output terminal A80 the control signal S which it supplies to the control terminal S50 of the controllable voltage generator 50. In later operation, the value of the controllable resistor 51 is adjusted in dependence on the state of the control signal S which is generated by the evaluating circuit 80.

After the values of the controllable resistors for all semiconductor chips on a wafer have been stored in the memory unit 220, the fuse elements 71 of each memory chip are programmed. For this purpose, the fuse elements of each memory chip are programmed by a programming unit 230 in dependence on the corresponding memory state for the respective memory chip.

FIG. 4 shows in table form the correlation of various values of the supply voltage VDLL with programming states of fuse elements for an ideal controllable voltage generator. In the example of FIG. 4, the memory circuit 70 contains four fuse elements. The fuse elements correspond to bits 0 to 3. The nominal value of the supply voltage is, for example, 1.5 V. If, for example, all controllable voltage generators 50 on the wafer were to behave in the same manner, the fuse elements 0 to 2 would have to be programmed by the programming unit 230 with the programming state "0" and the fuse element 3 would have to be programmed with the programming state "1", to reach the target value of 1.5 V.

However, since the controllable voltage generators of the individual semiconductor memory chips on the wafer behave differently, the target value of 1.5 V is reached, for example, only for memory chips located in the vicinity of the center of the wafer, at a value of the controllable resistor 51, which corresponds to the fuse states "1000". For memory chips located at the edge of the wafer, in contrast, the target value of 1.5 V is achieved, for example, at a value of the controllable resistor 51 which corresponds to the programming states of fuse elements 0 to 3 with the states "0100". As is shown by the table, an ideal controllable voltage generator would generate a supply voltage of 1.42 V with these states of the fuse elements.

As is shown by the table of FIG. 4, the controllable voltage generator 50 can be trimmed not only towards smaller values of the target value of 1.5 V but also toward larger values. This is achieved, for example, by the stabilized output voltage Vref being generated with a higher level than 1.5 V. For this purpose, the voltage stabilizing circuit 40 can contain, for example, a circuit for level shifting.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST F REFERENCE SYMBOLS

10 Memory cell array
20 Control circuit
30 Clock generator circuit
40 Voltage stabilizing circuit
50 Controllable voltage generator
51 Controllable resistor
60 Contact pad
70 Memory circuit
71 Fuse element
80 Evaluating circuit
200 Automatic production machine
210 Comparison device
220 Memory unit
230 Programming unit
AT Selection transistor
BL Bit line
CLKE External control signal
CLKI Internal control signal
DQ Data terminal
S Control signal SC Storage capacitor
SZ Memory cell
TM Test mode control signal
VDD External supply voltage
VDLL Supply voltage for clock generator circuit
Vtarget Nominal value of the supply voltage of the clock generator circuit
WL Word line

What is claimed is:

1. An integrated semiconductor memory with an adjustable internal voltage, comprising:
   a controllable voltage generator configured to receive a control signal and to generate a supply voltage whose level is a function of the control signal;
   a clock generator circuit configured to receive the supply voltage and an external clock signal and to generate an internal clock signal that exhibits a phase angle with respect to the external clock signal, the phase angle being dependent on the level of the supply voltage; and
   a contact pad that receives the supply voltage and provides external access to the supply voltage, the contact pad being configured to be contacted by contact points of a measuring instrument;
   wherein the controllable voltage generator enables adjustment of the control signal by supplying the supply voltage to the contact pad; and
   wherein a state of the control signal received by the controllable voltage generator is dependent on the level of the supply voltage measured by the measuring instrument at the contact pad.

2. The integrated semiconductor memory of claim 1, further comprising a control circuit configured to receive a test mode control signal and to generate the control signal with a state that is a function of a state of the test mode control signal.

3. The integrated semiconductor memory of claim 2, further comprising:
   a memory circuit; and
   an evaluating circuit configured to evaluate a state of the memory circuit and to generate the control signal as a function of the state of the memory circuit.

4. The integrated semiconductor memory of claim 3, wherein the memory circuit comprises at least one fuse element.

5. The integrated semiconductor memory of claim 3, wherein the controllable voltage generator comprises a controllable resistor whose value is variable as a function of the state of the control signal, and wherein the controllable voltage generator receives an input voltage and generates the supply voltage as a function of a voltage drop of the input voltage across the controllable resistor.

6. The integrated semiconductor memory of claim 5, further comprising a voltage stabilizing circuit configured to receive an external supply voltage and to generate the input voltage from the external supply voltage, the input voltage being stabilized relative to the external supply voltage.

7. The integrated semiconductor memory of claim 6, wherein the voltage stabilizing circuit comprises a band-gap reference circuit.

8. The integrated semiconductor memory of claim 1, wherein the clock generator circuit comprises a phase-locked loop circuit.

9. The integrated semiconductor memory of claim 1, wherein the clock generator circuit comprises a delay-locked loop circuit.

10. The integrated semiconductor memory of claim 1, wherein the contact pad is configured such that the supply voltage is detectable by an automatic production machine.

11. A production arrangement for producing the integrated semiconductor memory of claim 5, comprising:
    an automatic production machine for measuring the supply voltage of the clock generator circuit of the integrated semiconductor memory, the automatic production machine comprising: a comparison device configured to compare a first comparison voltage with the supply voltage received from the contact pad; and a memory unit configured to receive an output of the comparison device and to store memory states; wherein the automatic production machine generates the test mode control signal supplied to the control circuit, wherein a state of the test mode control signal is a function of a level of the supply voltage relative to the first comparison voltage; and
    wherein the automatic production machine changes at least one of the memory states of the memory unit as a function of the state of the test mode control signal at which the level of the supply voltage matches the first comparison voltage.

12. The production arrangement of claim 11, wherein the automatic production machine further comprises a programming unit configured to program a fuse element of the memory circuit of the integrated semiconductor memory as a function of a memory state stored in the memory unit.

\* \* \* \* \*